(12) United States Patent
Otsuka et al.

(10) Patent No.: US 8,585,842 B2
(45) Date of Patent: Nov. 19, 2013

(54) METHOD FOR MANUFACTURING MULTILAYER CERAMIC SUBSTRATE AND COMPOSITE SHEET

(75) Inventors: Yusuke Otsuka, Yasu (JP); Kazuo Kishida, Otsu (JP); Takahiro Takada, Otsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 300 days.

(21) Appl. No.: 12/621,642

(22) Filed: Nov. 19, 2009

(65) Prior Publication Data

US 2010/0059252 A1    Mar. 11, 2010

Related U.S. Application Data

(63) Continuation of application No. PCT/JP2009/052847, filed on Feb. 19, 2009.

(30) Foreign Application Priority Data

Mar. 28, 2008  (JP) .................................. 2008-085616
Jul. 18, 2008   (JP) .................................. 2008-186814

(51) Int. Cl.
*C03B 29/00*  (2006.01)
*B32B 9/04*   (2006.01)
*H05K 1/09*   (2006.01)

(52) U.S. Cl.
USPC ...................... 156/89.12; 156/89.11; 428/446; 174/250

(58) Field of Classification Search
USPC .......................................... 156/89.11, 89.12
See application file for complete search history.

(56) References Cited

U.S. PATENT DOCUMENTS

| 4,581,098 A | * | 4/1986 | Gregor ............................ 216/18 |
| 4,867,935 A | * | 9/1989 | Morrison, Jr. ............. 156/89.12 |
| 5,254,191 A | * | 10/1993 | Mikeska et al. ........... 156/89.15 |
| 5,855,711 A |   | 1/1999 | Araki et al. |

(Continued)

FOREIGN PATENT DOCUMENTS

| DE | 197 12 825 A1 | 10/1997 |
| EP | 1 335 393 A1  | 8/2003 |

(Continued)

OTHER PUBLICATIONS

Official Communication issued in corresponding European Patent Application No. 09726051.7, mailed on Jul. 26, 2010.

(Continued)

*Primary Examiner* — Philip Tucker
*Assistant Examiner* — Alex Efta
(74) *Attorney, Agent, or Firm* — Keating & Bennentt, LLP

(57) ABSTRACT

A high-quality resistor pattern and conductor pattern is formed on an external surface of a multilayer ceramic substrate by an ink jet method. A composite sheet including a first ceramic green layer and a shrinkage-retardant layer is formed, and a resistor pattern and a conductor pattern are formed on the first ceramic green layer of the composite sheet by an ink jet method. Subsequently, a plurality of second ceramic green layers are stacked with the composite sheet such that the shrinkage-retardant layer of the composite sheet defines an outermost layer, thus forming a multilayer composite including an unfired multilayer ceramic substrate and the shrinkage-retardant layer. Then, the multilayer composite is fired, and the shrinkage-retardant layer is removed to obtain a sintered multilayer ceramic substrate.

6 Claims, 2 Drawing Sheets

(56) References Cited

U.S. PATENT DOCUMENTS

| | | |
|---|---|---|
| 7,232,496 B2 * | 6/2007 | Yoshida et al. ............ 156/89.12 |
| 2002/0075632 A1 * | 6/2002 | Nakano et al. ................ 361/320 |
| 2006/0011896 A1 * | 1/2006 | Oda et al. ...................... 252/500 |
| 2007/0184251 A1 * | 8/2007 | Chikagawa .................. 428/210 |
| 2007/0286946 A1 | 12/2007 | Yamaguchi et al. |
| 2009/0104384 A1 | 4/2009 | Nakao et al. |

FOREIGN PATENT DOCUMENTS

| | | |
|---|---|---|
| JP | 06-077659 A | 3/1994 |
| JP | 09-266363 A | 10/1997 |
| JP | 10-200261 A | 7/1998 |
| JP | 2003-243827 A | 8/2003 |
| JP | 2005-039164 A | 2/2005 |
| JP | 2006-203185 A | 8/2006 |
| JP | 2007-123507 A | 5/2007 |
| JP | 2007-266112 A | 10/2007 |
| JP | 2007-329452 A | 12/2007 |

OTHER PUBLICATIONS

Official Communication issued in International Patent Application No. PCT/JP2009/052847, mailed on May 19, 2009.

Official Communication issued in corresponding Japanese Patent Application No. 2009-528936, mailed on Oct. 6, 2009.

* cited by examiner

METHOD FOR MANUFACTURING MULTILAYER CERAMIC SUBSTRATE AND COMPOSITE SHEET

This is a continuation of application No. PCT/JP2009/052847, filed on Feb. 19, 2009.

BACKGROUND OF THE INVENTION

1. Field of the Invention

The present invention relates to methods for manufacturing a multilayer ceramic substrate and to composite sheets. In particular, the present invention relates to a method for manufacturing a multilayer ceramic substrate in which a resistor pattern and/or conductor pattern is formed on the external surface of the multilayer ceramic substrate by an ink jet method, and to a composite sheet advantageously used in the manufacture of the multilayer ceramic substrate.

2. Description of the Related Art

A so-called constrained sintering process is a method for manufacturing a multilayer ceramic substrate relating to the present invention. For manufacturing a multilayer ceramic substrate by a constrained sintering process, a multilayer composite is prepared. The multilayer composite includes a plurality of ceramic green layers containing a low-temperature co-fired ceramic material and a shrinkage-retardant layer containing a sintering-resistant ceramic powder substantially not sintered under a condition for sintering the low-temperature co-fired ceramic material. The shrinkage-retardant layer is disposed on at least one main surface of an unfired multilayer ceramic substrate including the plurality of ceramic green layers.

The multilayer composite is subsequently fired under the condition for sintering the low-temperature co-fired ceramic material. Thus, a multilayer ceramic substrate is completed through sintering the ceramic green layers. The shrinkage-retardant layer is not shrunk by firing because the sintering-resistant ceramic powder contained in the shrinkage-retardant layer is not substantially sintered. Accordingly, the shrinkage-retardant layer restrains the ceramic green layers, so that the ceramic green layers shrink substantially only in the thickness direction, but are prevented from shrinking in the main surface direction. Consequently, the resulting multilayer ceramic substrate becomes difficult to deform non-uniformly, and the geometrical and dimensional precision of the multilayer ceramic substrate can be increased.

Subsequently, the shrinkage-retardant layer is removed, and thus a desired multilayer ceramic substrate is obtained.

If a resistor pattern and/or conductor pattern is provided on the external surface of the multilayer ceramic substrate, the resistor pattern and/or conductor pattern may be formed after removing the shrinkage-retardant layer. If the resistor pattern is provided, in general, a glass overcoat layer is additionally formed as a protective layer. The overcoat layer protects the resistor pattern from the influence of plating and ensures the reliability of the resistor pattern. For forming the resistor pattern and/or conductor pattern and the overcoat layer, firing steps are respectively performed. This means that the multilayer ceramic substrate undergoes repetition of firing steps, and the resulting multilayer ceramic substrate is brought into an excessively sintered state. Consequently, the mechanical strength and the electrical characteristics of the ceramic layers of the multilayer ceramic substrate may be varied, and the adhesion between the ceramic portion and the conductor portion may be reduced.

Accordingly, a process can be proposed in which the ceramic green layers and an unfired resistor pattern and overcoat layer are fired at one time in a state where the unfired resistor pattern and overcoat layer disposed on the outermost ceramic green layer of the multilayer composite are covered with a shrinkage-retardant layer. Thus, the ceramic green layer can avoid undergoing a plurality of firing steps.

In this process, however, when the shrinkage-retardant layer is removed, the shrinkage-retardant layer and the resistor pattern may be disadvantageously removed together, because the adhesion of the resistor pattern to the multilayer ceramic substrate is relatively low. Japanese Unexamined Patent Application Publication No. 2005-39164 proposes that the glass component contained in the overcoat layer is improved in softening point and composition to overcome the above disadvantage.

As another approach, a process is proposed in which a resistor pattern and a conductor pattern are formed on the external surface of a ceramic substrate, such as the multilayer ceramic substrate, by an ink jet method. The ink jet method can not only efficiently conduct the steps of forming the resistor pattern and the conductor pattern, but also immediately cope with the alteration of the pattern.

Unfortunately, the resistor ink and conductor ink used for the ink jet method contain a solvent and have low viscosity. Such an ink is liable to spread out undesirably when it is applied onto a normal ceramic green layer.

Accordingly, the resistor pattern and the conductor pattern cannot have high line fineness.

In addition, the solvent in the resistor ink or the conductor ink may dissolve the binder contained in the ceramic green layer, thereby roughing the surfaces of the resistor pattern and the conductor pattern.

SUMMARY OF THE INVENTION

In view of the above, preferred embodiments of the present invention provide a method for manufacturing a multilayer ceramic substrate through which the above problems can be solved.

Additional preferred embodiments of the present invention provide a composite sheet that can be advantageously used in the method for manufacturing a multilayer ceramic substrate, and that includes a resistor pattern and/or conductor pattern.

Further preferred embodiments of the present invention provide a composite sheet which can be advantageously used in the method for manufacturing a multilayer ceramic substrate, and onto which a resistor pattern and/or conductor pattern is to be formed.

A method for manufacturing a multilayer ceramic substrate according to a preferred embodiment of the present invention includes the steps of: preparing a first and a second low-temperature co-fired ceramic material, and a sintering-resistant ceramic powder that is substantially not sintered under a condition for sintering the first and the second low-temperature co-fired ceramic material; forming a composite sheet including a first ceramic green layer containing the first low-temperature co-fired ceramic material and a shrinkage-retardant layer containing a sintering-resistant ceramic powder; forming a resistor pattern and/or conductor pattern on the first ceramic green layer of the composite sheet by an ink jet method using a resistor ink and/or conductor ink; stacking a plurality of second ceramic green layers containing the second low-temperature co-fired ceramic material with the composite sheet having the resistor pattern and/or conductor pattern such that the shrinkage-retardant layer of the composite sheet defines an outermost layer, thus forming a multilayer composite including an unfired multilayer ceramic substrate and the shrinkage-retardant layer disposed at least one main surface of the unfired multilayer ceramic substrate; firing the multilayer composite under the condition for sintering the first and the second low-temperature co-fired ceramic material, thereby producing a sintered multilayer ceramic substrate; and then removing the shrinkage-retardant layer to obtain the multilayer ceramic substrate.

The resistor ink and/or conductor ink includes a solvent, and preferably, the first ceramic green layer can absorb the solvent to a greater extent than the second ceramic green layer.

Preferably, the first ceramic green layer has a voidage of about 30% or more, for example.

The first ceramic green layer includes a binder, and preferably, the binder has a solubility of about 14 g or less, for example, in the resistor ink and/or conductor ink. There is no problem in practice as long as the solubility is about 14 g or less. More preferably, the solubility is about 4 g or less, and still more preferably about 2 g or less, for example.

Preferably, the first low-temperature co-fired ceramic material and the second low-temperature co-fired ceramic material are the same.

Preferably, the first low-temperature co-fired ceramic material is a glass-based low-temperature co-fired ceramic material.

Preferably, the first ceramic green layer has a different color from the shrinkage-retardant layer.

Another preferred embodiment of the present invention is directed to a pattern-including composite sheet advantageously used in the method for manufacturing the multilayer ceramic substrate. The pattern-including composite sheet is obtained in the course of the above-described manufacturing method, and includes: a ceramic green layer containing a low-temperature co-fired ceramic material; a shrinkage-retardant layer disposed on the ceramic green layer and containing a sintering-resistant ceramic powder that is substantially not sintered under a condition for sintering the low-temperature co-fired ceramic material; and a resistor pattern and/or conductor pattern formed on the ceramic green layer by an ink jet method using a resistor ink and/or conductor ink.

In the pattern-including composite sheet as well, the ceramic green layer preferably has a voidage of about 30% or more, for example, and the binder contained in the ceramic green layer preferably has a solubility of about 14 g or less, for example, in the resistor ink and/or conductor ink.

A further preferred embodiment of the present invention is directed to a composite sheet advantageously used in the above method for manufacturing the multilayer ceramic substrate, and on which a resistor pattern and/or conductor pattern is to be formed. This composite sheet is obtained in the course of the above manufacturing method, and includes: a ceramic green layer containing a low-temperature co-fired ceramic material; and a shrinkage-retardant layer disposed on the ceramic green layer and containing a sintering-resistant ceramic powder that is substantially not sintered under a condition for sintering the low-temperature co-fired ceramic material. The ceramic green layer has a higher voidage than the shrinkage-retardant layer.

In various preferred embodiments of the present invention, the composite sheet including the first ceramic green layer and the shrinkage-retardant layer is formed before forming the multilayer composite, which is a main portion of the multilayer ceramic substrate, including a plurality of second ceramic green layers. A resistor pattern and/or conductor pattern is formed on the composite sheet when it is in this state. Consequently, a large amount of the solvent contained in the resistor ink and/or conductor ink can be absorbed in the first ceramic green layer, and then in the shrinkage-retardant layer. Also, the first ceramic green layer can more easily have a composition capable of rapidly absorbing the solvent than the second ceramic green layer.

Thus, the resistor pattern and/or conductor pattern formed by an ink jet method can be prevented from undesirably spreading out, and the resistor pattern and/or conductor pattern can exhibit high line fineness. Any binder that is difficult to dissolve in the resistor ink and the conductor ink can be used as the binder contained in the first ceramic green layer substantially without limitation, and accordingly, it can be prevented that unevenness is formed at the surface of the resistor pattern and/or conductor pattern formed on the first ceramic green layer.

The first ceramic green layer of the resulting multilayer ceramic substrate can serve as an overcoat layer protecting the resistor pattern and/or conductor pattern. The multilayer ceramic substrate including the resistor pattern and/or conductor pattern and the overcoat layer can be produced by firing only once. Thus, it can be prevented that the ceramic layers of the multilayer ceramic substrate are brought into an excessively sintered state, the characteristics of the ceramic layers are undesirably varied, and that the adhesion between the ceramic portion and the conductor portion is reduced.

The first ceramic green layer having the above functions is handled in a state of composite sheet lined with the shrinkage-retardant layer. Therefore, the shrinkage-retardant layer can also absorb the solvent. When the solvent content is high, a larger amount of the solvent can be absorbed more rapidly than in the case where only the first ceramic green layer absorbs the solvent. Consequently, the solvent remaining in the first ceramic green layer can be reduced. This contributes to achieving superior line fineness of the resistor pattern and/or conductor pattern, and contributes to forming a favorable surface. In particular, the solvent absorbed in the shrinkage-retardant layer is removed together with the shrinkage-retardant layer. Thus, the solvent remaining in the multilayer ceramic substrate can be reduced, and the influence of the solvent on the characteristics of the multilayer ceramic substrate can be reduced even more.

Since the first ceramic green layer is generally thin and weak, the handling of the first ceramic green layer is not easy. By forming such a first ceramic green layer on the shrinkage-retardant layer, the first ceramic green layer can be handled easily. If the first ceramic green layer has a high voidage, in particular, the first ceramic green layer becomes brittle. It is effective that such a first ceramic green layer is reinforced by the shrinkage-retardant layer.

In various preferred embodiments of the present invention, when the first ceramic green layer can absorb the solvent in the resistor ink and/or conductor ink to a greater extent than the second ceramic green layer, the above-described effects can be produced more reliably. By using a composition capable of sufficiently absorbing the solvent for only the first ceramic green layer, the composition of the second ceramic green layer can be selected without particular limitation, and thus the flexibility of design can be enhanced. Since the second ceramic green layers defining the main portion of the multilayer ceramic substrate have a composition satisfying preferred characteristics for the multilayer ceramic substrate, the multilayer ceramic substrate can exhibit superior characteristics.

If the first ceramic green layer has a voidage of about 30% or more, for example, or the solubility of the binder contained in the first ceramic greens layer is about 14 g or less, for example, in the resistor ink and/or conductor ink, the line fineness of and the smoothness at the surface of the resistor pattern and/or conductor pattern can be enhanced reliably.

If the first low-temperature co-fired ceramic material and the second low-temperature co-fired ceramic material are the same as each other, the first ceramic green layer and the second ceramic green layers are shrunk substantially in the same manner when being fired. Accordingly, it is not easy to produce heterogeneous phases or sintering failure resulting from interdiffusion caused by the use of different materials. Consequently, the resulting multilayer ceramic substrate can exhibit stable characteristics and enhanced reliability.

If the first ceramic green layer has a different color from the shrinkage-retardant layer, a defect at a thin point of the ceramic green layer can easily be detected according to the difference in color, in a state of composite sheet.

In the composite sheet of a preferred embodiment of the present invention, the ceramic green layer has a higher voidage than the shrinkage-retardant layer. Accordingly, the solvent of the ink in the ceramic green layer can be sucked to the shrinkage-retardant layer by capillary action. Thus, the solvent is not allowed to remain in the ceramic green layer.

Other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

Figure 1:
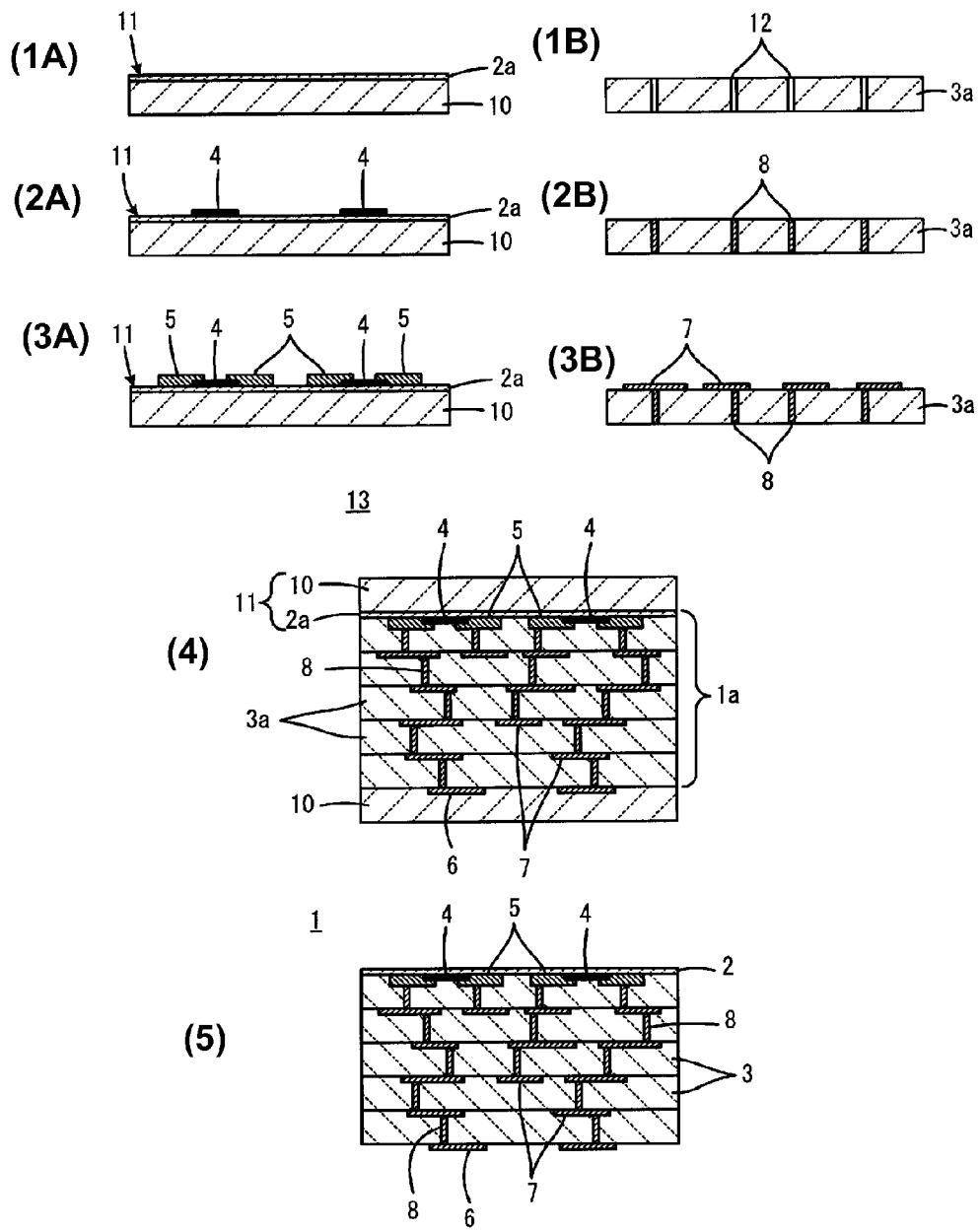
FIG. 1 is a representation of sectional views of representative steps of a method for manufacturing a multilayer ceramic substrate according to a first preferred embodiment of the present invention.

FIG. 1 illustrates a first preferred embodiment of the present invention. FIG. 1 shows sectional views of representative steps performed for manufacturing a multilayer ceramic substrate 1 shown in (5).

Referring to FIG. 1 (5), the multilayer ceramic substrate 1 has a multilayer structure including a first ceramic layer 2 serving as an overcoat layer and a plurality of second ceramic layers 3.

A resistor pattern 4 and a conductor pattern 5 are formed at one surface in the stacking direction of the stack of the plurality of second ceramic layers 3, and are covered with the first ceramic layer 2. An external conductor pattern 6 is formed on the other surface in the stacking direction of the stack of the second ceramic layers 3, and internal conductor patterns 7 are formed along the interfaces between the second ceramic layers 3. Furthermore, via-conductors 8 are formed so as to pass through the second ceramic layers 3 in the thickness direction.

For manufacturing such a multilayer ceramic substrate 1, the following process is performed.

First, a first and a second low-temperature co-fired ceramic material are prepared. Although the first low-temperature co-fired ceramic material and the second low-temperature co-fired ceramic material may be different from each other, the same material is preferably used in the present preferred embodiment. The low-temperature co-fired ceramic material refers to a ceramic material that can be sintered at about 1,050° C. or less, for example, and can be fired with a material having a low specific resistance, such as silver or copper.

Examples of the low-temperature co-fired ceramic material include glass composite-based low-temperature co-fired ceramic materials prepared by mixing a borosilicate glass, such as $SiO_2$-$B_2O_3$—CaO—$Al_2O_3$ glass or $SiO_2$-$B_2O_3$—CaO—$Al_2O_3$—$R_2O$ glass (R: alkali metal), to a ceramic powder, such as alumina, zirconia, magnesia or forsterite; glass-based low-temperature co-fired ceramic materials containing ZnO—MgO—$Al_2O_3$—$SiO_2$ glass or borosilicate glass; and non-glass low-temperature co-fired ceramic materials containing BaO—$Al_2O_3$—$SiO_2$ ceramic powder or $Al_2O_3$—CaO—$SiO_2$—MgO-$B_2O_3$ ceramic powder, for example.

In addition, a sintering-resistant ceramic powder is prepared which is substantially not sintered under a condition for sintering the low-temperature co-fired ceramic material, that is, at the sintering temperature of the low-temperature co-fired ceramic material. Alumina, zirconia, magnesia, forsterite or the like can be advantageously used as the sintering-resistant ceramic powder.

Turning now to FIG. 1 (1A), a composite sheet 11 including a first ceramic green layer 2a and a shrinkage-retardant layer 10 is formed. The first ceramic green layer 2a is intended as the first ceramic layer 2 shown in FIG. 1 (5).

For forming the composite sheet 11, first, a ceramic green sheet intended as the shrinkage-retardant layer 10 is formed. A ceramic slurry is prepared by mixing a solvent, an organic binder, a dispersant, a plasticizer and other additives to the sintering-resistant ceramic powder described above. The ceramic green sheet for the shrinkage-retardant layer can be formed by forming a sheet of the ceramic slurry on a carrier film (not shown), such as a PET film, by a doctor blade method.

A ceramic slurry is prepared by adding an appropriate amount of each of solvent, organic binder, dispersant, plasticizer and so forth to the low-temperature co-fired ceramic material powder described above and mixing together. The first ceramic green layer 2a is formed by forming a sheet of the ceramic slurry on the ceramic green sheet for the shrinkage-retardant layer by a doctor blade method or other suitable process.

Alternatively, the first ceramic green layer 2a may be prepared in a form of green sheet, and the green sheet may be stacked on the ceramic green sheet for the shrinkage-retardant layer and pressed to join together. The first ceramic green layer 2a may also be formed on the ceramic green sheet for the shrinkage-retardant layer by, for example, screen printing.

If the first ceramic green layer 2a contains the same low-temperature co-fired ceramic material as the second ceramic green layers 3a described below, the first ceramic green layer 2a and the second ceramic green layers 3a are shrunk substantially in the same manner as each other when being fired. In addition, it becomes difficult to produce heterogeneous phases or sintering failure resulting from interdiffusion caused by the use of different materials. Consequently, the resulting multilayer ceramic substrate 1 can exhibit stable characteristics and enhanced reliability.

When the first low-temperature co-fired ceramic material is a glass based low-temperature co-fired ceramic material not containing a ceramic powder, it facilitates laser trimming and can increase the trimming speed. In this instance, the low-temperature co-fired ceramic material contained in the second ceramic green layers 3a may be the same as the glass-based low-temperature co-fired ceramic material of the first ceramic green layer 2a, or may be glass composite-based low-temperature co-fired ceramic material or non-glass low-temperature co-fired ceramic material.

Subsequently, a resistor pattern 4 is formed on the first ceramic green layer 2a of the resulting composite sheet 11 by an ink jet method using a resistor ink, as shown in FIG. 1 (2A).

Then, a conductor pattern 4 is formed on the first ceramic green layer 2a of the resulting composite sheet 11 by an ink jet method using a conductor ink, as shown in FIG. 1 (3A). By forming the resistor pattern 4 before the conductor pattern 5, as in the present preferred embodiment, the resistor pattern 4 can be formed uniformly, so that the variation in resistance can be reduced. In addition, the reliability in joining the resistor pattern 4 and the conductor pattern 5 can be enhanced.

In the states shown in FIGS. 1 (2A) and 1 (3A), the solvent in the resistor ink of the resistor pattern 4 and the solvent in the conductor ink of the conductor pattern 5 are immediately absorbed into the first ceramic green layer 2a, and the residual solvents, not absorbed in the first ceramic green layer 2a, is then absorbed into the shrinkage-retardant layer 10. Thus, the resistor pattern 4 and the conductor pattern 5 are prevented from undesirably spreading out, and their surfaces become smooth.

In order to ensure this effect, it is preferable that the first ceramic green layer 2a absorb the solvent to a greater extent than the below-described second ceramic green layer 3a. In order to ensure the above effect more, the first ceramic green layer 2a preferably has a voidage of about 30% or more, for example. Preferably, the upper limit of the voidage is about 60%, for example. In order to increase the voidage, the binder content is reduced. If the binder content is excessively low, however, the inorganic components of the ink can penetrate the first ceramic green layer 2a to cause a short circuit or a defect in characteristics. A first ceramic green layer having a voidage of about 60% or less, for example, can prevent these problems.

In order to further ensure the above effect, preferably, the solubilities of the binder contained in the first ceramic green layer 2a in the resistor ink and the conductor ink are 14 g or less. The solubility mentioned herein refers to the weight (unit: g) of solute dissolved in 100 g of solvent. The solubility of the binder also depends on the solvent of the ink. For example, if BCA (butyl Carbitol acetate) is used as the ink solvent, a butyral binder (polyvinyl butyral resin) having a butyralization degree of about 60 mol % or more and having about 30 mol % or more of hydroxy group can be used to obtain a solubility of about 14 g or less, particularly of about 2 g or less, for example.

The solubilities of the binders contained in the shrinkage-retardant layer 10 and the second ceramic green layer 3a are each higher than the maximum solubility of about 14 g of the binder contained in the first ceramic green layer 2a.

When the solubility of the binder of the shrinkage-retardant layer 10 is higher, the solvent of the ink penetrating the shrinkage-retardant layer 10 is mixed with the binder to reduce the flowability, and consequently the ink is prevented from flowing back to the first ceramic green layer 2a. In addition, when the solubility of the binder in the second ceramic green layer 3a is higher, the solvents slightly remaining in the resistor pattern 4 and the conductor pattern 5 formed on the first ceramic green layer 2a are mixed with the binder of the second ceramic green layer 3a when stacking sheets, and consequently the adhesion between the resistor pattern 4 and conductor pattern 5 and the second ceramic green layer 3a is increased.

From the viewpoint of enhancing the debinding properties, it is preferable that the solubilities of the shrinkage-retardant layer 10 and second ceramic green layers 3a having larger thicknesses than the first ceramic green layer 2a be higher than about 14 g, for example. A binder having a low solubility may easily be changed into a higher molecular weight compound or may increase the intermolecular force, and accordingly debinding becomes difficult.

Preferably, the first ceramic green layer 2a has a thickness in the range of about 5 µm to about 50 µm, for example, before firing. A first ceramic green layer having a thickness of about 5 µm or more, for example, can sufficiently absorb the solvent of the ink. A first ceramic green layer 2a having a thickness of about 50 µm, for example, or less can ensure superior printability, and if the laser trimming of the resistor pattern 4 is required, it can be performed in a short time with high precision. If the resistor pattern is not formed, or if the resistor pattern does not require laser trimming, disadvantages in increasing the thickness of the first ceramic green layer 2a are few, and accordingly it is not a problem even if the thickness may be more than about 50 µm. More preferably, the first ceramic green layer 2a has a thickness of about 5 µm to about 35 µm, for example.

Preferably, the shrinkage-retardant layer 10 has a thickness of about 50 µm to about 300 µm, for example, before firing. A shrinkage-retardant layer 10 having a thickness of about 50 µm or more, for example, can further absorb the solvent of the ink absorbed by the first ceramic green layer 2a and can sufficiently prevent the shrinkage. Also, a shrinkage-retardant layer having a thickness of about 300 µm or less, for example, is easy to form and has superior debinding properties. If the solvent content in the ink is low, the thickness of the shrinkage-retardant layer may be less than about 50 µm, for example.

Preferably, the shrinkage-retardant layer 10 has a voidage in the range of about 10% to about 50%, for example. From the viewpoint of helping the first ceramic green layer 2a absorb the solvent of the ink, the shrinkage-retardant layer 10 preferably has a voidage of about 10% or more, for example. It is however preferable that the upper limit of the voidage be about 50%, for example, from the viewpoint of sufficiently preventing the shrinkage.

The voidage of the shrinkage-retardant layer 10 is preferably lower than that of the first ceramic green layer 2a. In this instance, the solvent of the ink in the first ceramic green layer 2a can be sucked to the shrinkage-retardant layer 10 by capillary action. Thus, the solvent cannot be allowed to remain in the first ceramic green layer 2a.

Turning now to FIG. 1 (1B), ceramic green sheets are prepared for the second ceramic green layers 3a. The second ceramic green layers 3a are intended as the second ceramic layers 3 shown in FIG. 1 (5). A ceramic slurry is prepared by adding an appropriate amount of each of solvent, organic binder, dispersant, plasticizer and so forth to the above described low-temperature co-fired ceramic material powder and mixing together. The ceramic green sheet for the second ceramic green layer 3a is formed by forming a sheet of the ceramic slurry by a doctor blade method or other suitable process.

Then, through-holes 12 in which via-conductors 8 are to be provided are formed in the ceramic green sheets for the second ceramic green layers 3a, as shown in FIG. 1 (1B).

The through-holes 12 are filled with an electroconductive paste to form via-conductors 8, as shown in FIG. 1 (2B).

Then, an electroconductive paste is printed on each ceramic green sheet for the second ceramic green layers 3a by, for example, screen printing, thus forming an internal conductor pattern 7, as shown in FIG. 1 (3B). The external conductor pattern 6 is also formed in the same manner, but not shown in FIG. 1 (3B).

The electroconductive paste forming the via-conductor 8, the internal conductor patterns 7 and the external conductor pattern 6 contains a conductive component essentially composed of preferably a low-melting-point metal, such as silver, copper or gold.

Turning now to FIG. 1 (4), the ceramic green sheets for the second ceramic green layers 3a are stacked with the composite sheet 11 having the resistor pattern 4 and the conductor pattern 5 such that the shrinkage-retardant layer 10 of the composite sheet 11 defines the outermost layer, and thus a multilayer composite 13 is completed. The multilayer composite includes an unfired multilayer ceramic substrate 1a and at least one shrinkage-retardant layer 10 disposed on a main surface of the multilayer ceramic substrate 1a, and, in the present preferred embodiment, other shrinkage-retardant layers 10 is provided on the main surface opposite to the main surface on which the shrinkage-retardant layer 10 of the composite sheet 11 is disposed.

Although the second ceramic green layers 3a are preferably prepared in a form of ceramic green sheets, as described above, the sheets are not necessarily ceramic green sheets capable of being solely handled, and may be layers that are formed by application of a ceramic slurry and act as the second ceramic green layers 3a as they are.

The composite sheet 11 and the second ceramic green layers 3a shown in FIG. 1 (4) are illustrated in such a manner that the composite sheet 11 shown in FIGS. 1 (1A) to 1 (3A) and the second ceramic green sheets 3a shown in FIGS. 1 (1B) to 1 (3B) are turned upside down.

Subsequently, the unfired multilayer composite 13 shown in FIG. 1 (4) is fired under a condition for sintering the low-temperature co-fired ceramic material, for example, at a temperature of about 800° C. to about 1000° C. The shrinkage-retardant layer 10 does not substantially shrink in this firing step, and restrains the unfired multilayer ceramic substrate 1a so as not to shrink in the main surface direction. While the shrinkage of the first and second ceramic green layers 2a and 3a of the unfired multilayer ceramic substrate 1a is retarded in the main surface direction respectively, and while the low-temperature co-fired ceramic material contained in the unfired multilayer ceramic substrate is sintered and shrinks substantially only in the thickness direction, the first and second ceramic layers 2 and 3 are formed in the sintered multilayer ceramic substrate 1.

The resistor pattern 4, the conductor pattern 5, the external conductor pattern 6, the internal conductor pattern 7 and the via-conductor 8 are sintered through the above firing step.

Subsequently, the shrinkage-retardant layer 10 is removed by, for example, ultrasonic cleaning. Since the shrinkage-retardant layer 10 is not sintered in the firing step and is in a porous state, it can be removed easily.

Thus, the multilayer ceramic substrate 1 as shown in FIG. 1 (5) is completed.

Preferably, the first ceramic green layer 2a and the shrinkage-retardant layer 10 are different in color to the extent that their colors are distinguished. Consequently, defects (including pin holes) caused at thin points in the first ceramic green layer 2a of the composite sheet 11 can be easily detected according to the difference in color.

Since the first ceramic green layer 2a is as thin as about 5 μm to about 50 μm, particularly about 5 μm to about 35 μm, for example, as described above, it is difficult to form the first ceramic green layer uniformly without defects. For example, if the first ceramic green layer 2a and the shrinkage-retardant layer 10 are given different colors by, for example, coloring either the first ceramic green layer 2a or the shrinkage-retardant layer 10, defects caused by reducing the thickness of the first ceramic green layer 2a can easily be detected.

More specifically, the first ceramic green layer 2a turns to the first ceramic layer 2 finally in the resulting multilayer ceramic substrate 1 obtained by firing, and the first ceramic layer 2 serves as an overcoat layer protecting the resistor pattern 4 being the surface layer of the multilayer ceramic substrate 1 from the influence of plating and ensuring the reliability of the resistor pattern 4. If a defect is produced at a thin point in the overcoat layer, the overcoat layer cannot exhibit sufficient resistance to plating or ensure the reliability of the resistor pattern 4.

The above-described compositions form a white first ceramic green layer 2a and shrinkage-retardant layer 10. Even if a thin point is produced in the first ceramic green layer 2a, therefore, it is difficult to find the thin point. On the other hand, if the first ceramic green layer 2a and the shrinkage-retardant layer 10 have different colors, the color of the underlying shrinkage-retardant layer 10 can be easily observed at the region corresponding to the thin point of the first ceramic green layer 2a. By coloring the first ceramic green layer 2a or the shrinkage-retardant layer 10, a distinct contrast occurs between the colors at the thin point and its surroundings, and thus the thin point can easily be detected.

The difference in color between the first ceramic green layer 2a and the shrinkage-retardant layer 10 makes clear the boundary between the first ceramic green layer 2a and the shrinkage-retardant layer 10 when a section of the composite is observed in the stacking direction. Consequently, the thickness of the first ceramic green layer 2a serving as an overcoat layer can easily be measured. This means that the thickness can be easily fed back and thus easily be controlled.

In order to vary the color, an inorganic coloring agent may be added, or an organic coloring agent may be added. A commercially available inorganic pigment can be used as the inorganic coloring agent. Examples of such an inorganic coloring agent include oxide powders, such as of chromium, cobalt, copper, nickel, iron and titanium, for example. The organic coloring agent may be a commercially available organic pigment, such as azo or quinacridone pigment (or dye), for example.

While the inorganic coloring agent remains even after firing, the organic coloring agent disappears with the binder component by firing. Accordingly, the use of an inorganic coloring agent is advantageous in distinguishing between the first ceramic layer 2 and the shrinkage-retardant layer 10 in the multilayer ceramic substrate 1 after firing. In the use of an organic coloring agent, on the other hand, the difference in color is substantially not left between the first ceramic layer 2 and the shrinkage-retardant layer 10 in the multilayer ceramic substrate 1 after firing.

Accordingly, it is particularly preferable that an inorganic coloring agent be used, and is preferable that the inorganic coloring agent be added to the first ceramic green layer 2a. However, the inorganic coloring agent may negatively affect the sintering properties or the like of the first ceramic green layer 2a and other layers of the unfired multilayer composite 13. For the use of an inorganic coloring agent, its content is preferably 3 parts by weight or less relative to 100 parts by weight of the low-temperature co-fired ceramic material in the first ceramic green layer 2a, for example. If an organic coloring agent is used, it is preferable, but not particularly limited to, that its content be 0.1 to 1.5 parts by weight relative to 100 parts by weight of the low-temperature co-fired ceramic material in the first ceramic green layer 2a, for example.

Figure 2:
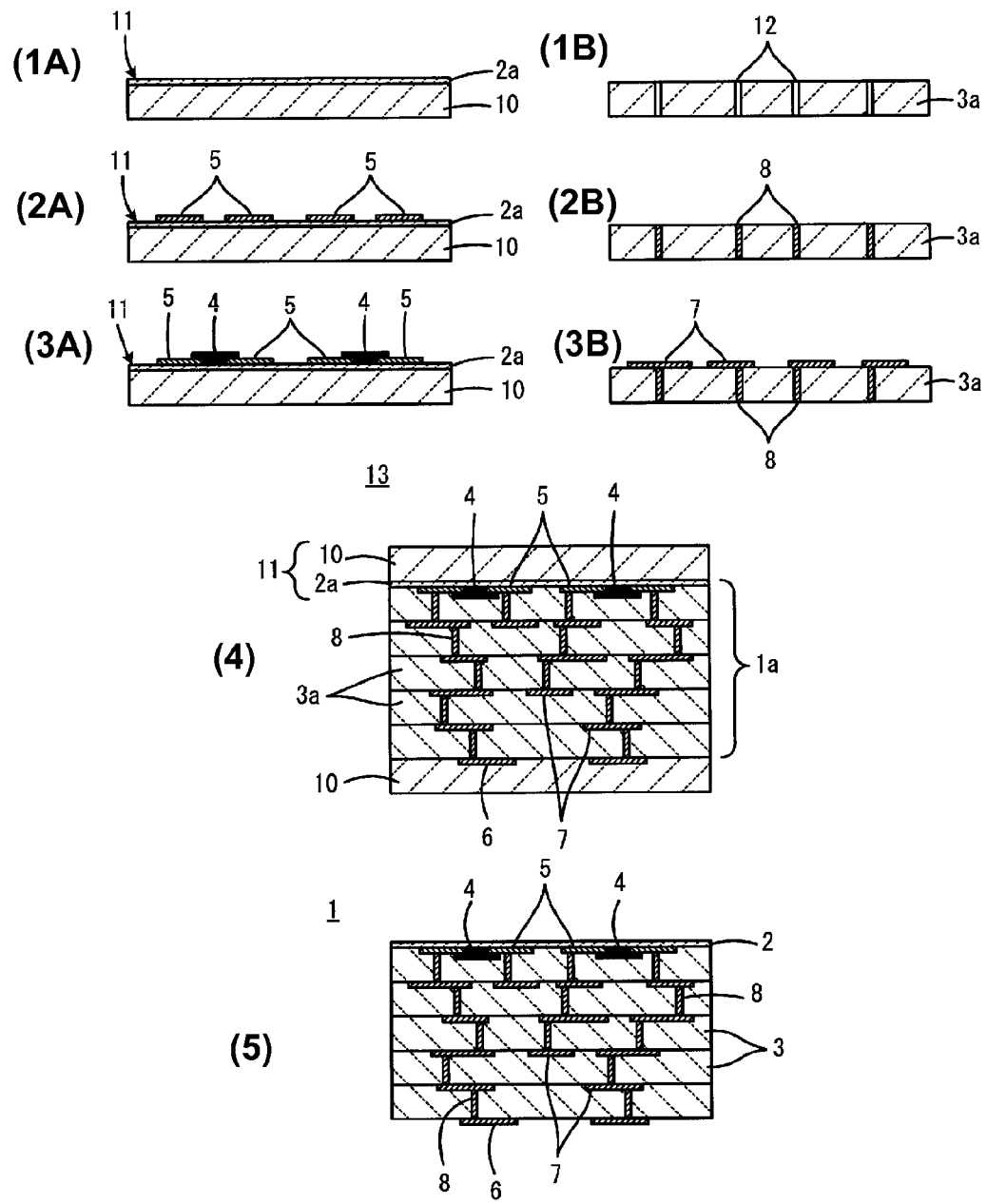
FIG. 2 is a representation of sectional views of representative steps of a method for manufacturing a multilayer ceramic substrate according to a second preferred embodiment of the present invention.

FIG. 2 is a representation illustrating a second preferred embodiment of the present invention, corresponding to FIG. 1. The elements in FIG. 2 corresponding to the elements shown in FIG. 1 are designated by the same reference numerals, and the same descriptions will be omitted.

In the second preferred embodiment, the conductor pattern 5 preferably is first formed on the first ceramic green layer 2a of the composite sheet 11 by an ink jet method, and subsequently the resistor pattern 4 is formed by an ink jet method, as shown in FIGS. 2 (2A) and 2 (3A). The other structure is the same as in the above-described first preferred embodiment.

While the present invention has been described with reference to exemplary preferred embodiments, it is to be understood that various modifications may be made without departing from the scope of the invention.

Although in the preferred embodiments shown in the drawings, the composite sheet 11 having the resistor pattern 4 and the conductor pattern 5 is disposed only on one main surface of the multilayer composite 13, the composite sheet 11 may be disposed on both main surfaces.

Although the first ceramic layer 2 serving as an overcoat layer is formed so as to cover the entire main surface of the multilayer ceramic substrate 1 in the above preferred embodiments, it may be formed so as to expose part of, for example, the conductor pattern 5. For forming the first ceramic layer 2 so as to expose part of the conductor pattern 5, the first ceramic green layer 2a may be formed so as to have an opening for partially exposing the conductor pattern 5, or the opening may be formed by irradiating the first ceramic layer 2 with laser light after firing the first ceramic green layer 2a formed over the entire main surface.

While both the resistor pattern 4 and the conductor pattern 5 are provided in the above preferred embodiments, the present invention can be applied to the case where either of them is provided.

While the shrinkage-retardant layer 10 is disposed along both main surfaces of the unfired multilayer ceramic substrate 1a, it may be disposed along only one of the main surfaces.

To confirm that the present invention is effective, the following experimental examples were conducted. In the experimental examples, a multilayer ceramic substrate 1 was produced according to the process shown in FIG. 1.

A ceramic slurry was prepared by mixing 7 parts by weight of butyral resin, 2 parts by weight of phthalate-abased plasticizer, 20 parts by weight of ethanol, and 33 parts by weight of toluene to 100 parts by weight of $Al_2O_3$ powder. The ceramic green sheet for the shrinkage-retardant layer 10 was formed by forming a sheet of the ceramic slurry to a thickness of 200 μm.

A ceramic slurry was prepared by mixing a binder resin having a solubility in the ink solvent shown in Table 1 to a low-temperature co-fired ceramic material containing 55% by weight of $SiO_2$—CaO—$Al_2O_3$-$B_2O_3$ glass powder and 45% by weight of $Al_2O_3$ powder, and then further mixing the resin mixture, toluene and ethanol in such proportions as the first ceramic green layer 2a would have a voidage shown in Table 1. The first ceramic green layer 2a was formed by forming a sheet of the ceramic slurry to a thickness of 30 μm on the ceramic green sheet for the shrinkage-retardant layer 10.

A resistor ink used for forming the resistor pattern 4 by an ink jet method was prepared by mixing 20% by weight of ruthenium dioxide powder and 80% by weight of glass powder, and further adding and mixing predetermined amounts each of ethyl cellulose-based resin and butyl Carbitol acetate as vehicle components to the mixture.

A conductor ink used for forming the conductor pattern 5 by an ink jet method was prepared by mixing a predetermined amount of each of ethyl cellulose-based resin and butyl Carbitol acetate as vehicle components to silver powder.

A ceramic slurry was prepared by adding acrylic resin, toluene and ethanol to a low-temperature co-fired ceramic material containing 55% by weight of $SiO_2$—CaO—$Al_2O_3$-$B_2O_3$ glass powder and 45% by weight of $Al_2O_3$ powder. Ceramic green sheets for the second ceramic green layers 3a were formed by forming sheets of the ceramic slurry to a thickness of 200 μm.

An electroconductive paste for forming the external conductor pattern 6, the internal conductor pattern 7 and the via-conductor 8 was prepared by adding a predetermined amount of each of ethyl cellulose-based resin and terpineol as vehicle components to a mixture containing silver powder and $Al_2O_3$ powder in a weight ratio of 100:1.

In Table 1, Samples 11 and 12 are comparative examples, which were formed such that the resistor pattern 4 and the conductor pattern 5 were formed on a single sheet defined by only the first ceramic green layer 2a without using the shrinkage-retardant layer 10. Although Sample 10 is an example of the present invention, the solubility of the binder contained in the first ceramic green layer 2a was outside the preferred range and over 14 g.

The resistor pattern 4 and the conductor pattern 5 at the surface of each resulting multilayer ceramic substrate of the examples were evaluated by observing the surface state and the line fineness through a microscope. The evaluation results are shown in Table 1.

TABLE 1

| Sample No. | Binder solubility (g) | Voidage (%) | Surface state | Line fineness |
|---|---|---|---|---|
| 1 | 0.16 | 44 | Good | 108 |
| 2 | 0.71 | 44 | Good | 108 |
| 3 | 2 | 44 | Good | 110 |
| 4 | 0.71 | 30 | Good | 111 |
| 5 | 3.77 | 42 | Fair | 113 |
| 6 | 0.16 | 25 | Good | 128 |
| 7 | 3.77 | 25 | Fair | 131 |
| 8 | 8.80 | 42 | Fair | 114 |
| 9 | 13.51 | 25 | Fair | 133 |
| 10 | 15.42 | 40 | Bad | 115 |
| 11 (Comparative Example) | 0.16 | 44 | Bad | 137 |
| 12 (Comparative Example) | 2 | 30 | Bad | 140 |

In the column of the surface state in Table 1, "Good" represents that the resistor pattern and the conductor pattern had superior surfaces without unevenness; "Fair" represents that the surfaces of the patterns were slightly uneven to such an extent as not to affect the electric characteristics; and "Bad" represents that a pinhole or a crack occurred in the surface.

The line fineness in Table 1 is expressed by an index of the average width of actually printed lines with respect to the intended width defined as 100. When the line fineness is 115 or less, it is determined to be good; when it is more than 115 and 135 or less, it is determined to be nearly good; and when it is more than 135, the conductor pattern undesirably spreads out to cause a short circuit, or the resistor pattern undesirably spreads out to deviate the resistance from the intended value extensively.

Samples 1 to 10 shown in Table 1 are within the scope of the present invention. Samples 1 to 10, particularly Samples to 4, satisfy both the preferred condition that the binder solubility is about 2 g or less and the preferred condition that voidage is about 30% or more, and result in favorable surface states and line fineness.

Samples 5, 7, 8 and 9 exhibited binder solubilities of more than about 2 g, but the solubilities were still as low as about 14 g or less. Accordingly, they have no problem in practice though the surface states were "Fair". Samples 6, 7 and 9 of the Samples 6, 7, 8 and 9 exhibited voidages of less than 30%; hence, their line fineness was inferior to that of Sample 8 having a voidage of about 30% or more.

Sample 10 exhibited a binder solubility of more than 14 g. Accordingly, the surface state was determined to be bad, but the line fineness was good because of the voidage of about 30% or more.

Samples 11 and 12 of comparative examples do not have the shrinkage-retardant layer 10. Accordingly, only the first ceramic green layer 2a having a thickness of about 30 μm absorbs the ink solvent, but cannot absorb it sufficiently. Consequently, the surface state was determined to be bad and the line fineness was inferior even though the binder solubility and the voidage are within the preferred ranges.

Although the results are not shown in Table 1, the resistor pattern 4 and the conductor pattern 5 formed only on a second ceramic green layer 3a or only on the shrinkage-retardant layer 10 were evaluated. The solubilities of both binders ere 14 g or more and the voidages were lower than about 30%. Thus the results were not good.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A method for manufacturing a multilayer ceramic substrate, the method comprising the steps of:
   preparing a first low-temperature co-fired ceramic material and a second low-temperature co-fired ceramic material, and a sintering-resistant ceramic powder that is substantially not sintered under a condition for sintering the first and the second low-temperature co-fired ceramic material;
   forming a composite sheet including a first ceramic green layer containing the first low-temperature co-fired ceramic material and a shrinkage-retardant layer containing the sintering-resistant ceramic powder;
   forming a resistor pattern and/or a conductor pattern on the first ceramic green layer of the composite sheet by an ink jet method using a resistor ink and/or a conductor ink;
   stacking a plurality of second ceramic green layers containing the second low-temperature co-fired ceramic material with the composite sheet having the resistor pattern and/or the conductor pattern such that the shrinkage-retardant layer of the composite sheet defines an outermost layer, thus forming a multilayer composite including an unfired multilayer ceramic substrate and the shrinkage-retardant layer disposed at at least one main surface of the unfired multilayer ceramic substrate;
   firing the multilayer composite under the condition for sintering the first and the second low-temperature co-fired ceramic material, thereby producing a sintered multilayer ceramic substrate; and
   removing the shrinkage-retardant layer to obtain the multilayer ceramic substrate; wherein
   the first ceramic green layer has a voidage in a range of about 30% to about 60%;
   the shrinkage-retardant layer has a voidage in a range of about 10% to about 50%;
   the voidage of the shrinkage-retardant layer is less than the voidage of the first ceramic green layer; and
   each of the resistor pattern and/or the conductor pattern has a line fineness after the firing step of about 135 or less, where the line fineness is defined as an index of an average width of each of the resistor pattern and/or the conductor pattern with respect to an intended width of each of the resistor pattern and/or the conductor pattern that is defined as 100.

2. The method for manufacturing the multilayer ceramic substrate according to claim 1, wherein the resistor ink and/or the conductor ink includes a solvent, and the first ceramic green layer can absorb the solvent to a greater extent than the second ceramic green layer.

3. The method for manufacturing the multilayer ceramic substrate according to claim 1, wherein the first ceramic green layer includes a binder, and the binder has a solubility of about 14 g or less in the resistor ink and/or the conductor ink.

4. The method for manufacturing the multilayer ceramic substrate according to claim 1, wherein the first low-temperature co-fired ceramic material and the second low-temperature co-fired ceramic material are the same.

5. The method for manufacturing the multilayer ceramic substrate according to claim 1, wherein the first low-temperature co-fired ceramic material is a glass-based low-temperature co-fired ceramic material.

6. The method for manufacturing the multilayer ceramic substrate according to claim 1, wherein the first ceramic green layer has a different color than that of the shrinkage-retardant layer.

* * * * *